US007127385B2

(12) United States Patent
Komoda et al.

(10) Patent No.: US 7,127,385 B2
(45) Date of Patent: Oct. 24, 2006

(54) DELAY TIME ESTIMATION METHOD AND RECORDING MEDIUM STORING ESTIMATION PROGRAM

(75) Inventors: Michio Komoda, Tokyo (JP); Shigeru Kuriyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 749 days.

(21) Appl. No.: 09/879,197

(22) Filed: Jun. 13, 2001

(65) Prior Publication Data

US 2002/0077799 A1 Jun. 20, 2002

(30) Foreign Application Priority Data

Oct. 13, 2000 (JP) ............................. 2000-314251

(51) Int. Cl.
*G06F 17/50* (2006.01)
(52) U.S. Cl. ............................. 703/19; 703/13; 703/14; 703/15; 716/1; 716/4; 716/6; 716/17
(58) Field of Classification Search ................. 703/14, 703/13, 17, 19, 15; 716/4, 6, 17
See application file for complete search history.

(56) References Cited

U.S. PATENT DOCUMENTS

| 5,274,568 | A | * | 12/1993 | Blinne et al. | .................. | 716/6 |
| 5,345,401 | A | * | 9/1994 | Tani | ............................. | 703/16 |
| 5,751,593 | A | * | 5/1998 | Pullela et al. | .................. | 716/6 |
| 5,838,947 | A | * | 11/1998 | Sarin | ............................. | 703/14 |
| 6,028,995 | A | * | 2/2000 | Jetton et al. | .................. | 703/19 |
| 6,066,177 | A | * | 5/2000 | Hatsuda | ........................ | 703/19 |
| 6,099,576 | A | * | 8/2000 | Jiang | .............................. | 716/1 |
| 6,304,998 | B1 | * | 10/2001 | Kamiya et al. | ................. | 716/4 |
| 6,425,115 | B1 | * | 7/2002 | Risler et al. | .................. | 716/17 |
| 6,473,725 | B1 | * | 10/2002 | Schoellkopf et al. | ......... | 703/15 |
| 6,477,695 | B1 | * | 11/2002 | Gandhi | ......................... | 716/17 |
| 6,557,150 | B1 | * | 4/2003 | Honmura et al. | .............. | 716/6 |
| 6,606,587 | B1 | * | 8/2003 | Nassif et al. | ................. | 703/14 |
| 6,629,299 | B1 | * | 9/2003 | Iwanishi | ........................ | 716/6 |
| 6,684,375 | B1 | * | 1/2004 | Tsukiyama et al. | ............ | 716/6 |

FOREIGN PATENT DOCUMENTS

JP     A 9-211087        8/1997
JP     2000163460 A  *  6/2000

OTHER PUBLICATIONS

"CMOS Gate Delay Models for General RLC Loading", R. Arunachalam et al, Proceedings International Conference on Computer Design, ICCD 97', IEEE 1997.*

"A Comprehensive Submicrometer MOST Delay Model and its Application to CMOS Buffers", P. Cocchini et al, IEEE Journal o Solid-State Circuits, vol. 32, No. 8, Aug. 1997.*

(Continued)

*Primary Examiner*—Fred Ferris
(74) *Attorney, Agent, or Firm*—Buchanan Ingersoll & Rooney PC

(57) ABSTRACT

The operating characteristic of a transistor, modeled by a resistive element having fixed resistance and a power source voltage that varies with time, is segmented into a linearity region in which a current increases as a gate potential varies and a saturation region in which the current gradually decreases as the gate potential remains at a constant level, so that gradual decrease in current in a saturation region of the transistor is properly reflected and a delay time is estimated in a precise manner.

5 Claims, 7 Drawing Sheets

OTHER PUBLICATIONS

"Efficent Gate Delay Modeling for Large Interconnect Loads", A.B. Kahng et al, IEEE 0-8186-7286-2/96, IEEE 1996.*

"Transistor-Level Estimation of worst-Case Delay in MOS VLSI Circuits", M.R. Dagenais, IEEE Transactions on Computer Aide Design, vol. II, No. 3, Mar. 1992.*

"Modeling the Driving-Point Characteristic of Resistive Interconnect for Accurate Delay Estimation", Proc. IEEE International Conference on Computer Aided Design, 1989, Peter R. O'Brien et al., IEEE.

"A Gate-Delay Model for High-Speed CMOS Circuits", Proc. 31$^{st}$ ACM/IEEE Design Automation Conference, 1994, Florentin Dartu et al., The University of Texas at Austin, Austin, Texas 78712.

U.S. Appl. No. 09/878,352, Michio Komoda et al., "Method of Producing Load for Delay Time Calculation and Recording Medium", June. 12, 2001.

* cited by examiner

DELAY TIME ESTIMATION METHOD AND RECORDING MEDIUM STORING ESTIMATION PROGRAM

BACKGROUND OF THE INVENTION

1. Field of the Invention

The present invention generally relates to delay time estimation methods for estimating a delay time in a logic circuit composed of transistors and to recording mediums in which a computer program for executing a delay time estimation method is stored. More particularly, the present invention relates to a delay-time estimation method and a recording medium storing an estimation program with which efficient and precise estimation of delay time is possible.

2. Description of the Related Art

The necessity for accurate signal analysis in a logic circuit is growing for designers of high-speed large-scale LSIs. Signal delay is one of the most important parameters because it is important for an LSI designer to know a timing margin in order to determine whether an LSI can operate properly. Methods for modeling and estimating time delay have been proposed.

FIGS. 9 through 11 show a processing flow for delay time estimation according to the related art. Referring to FIG. 9, the related-art delay estimation includes extraction of information relating to connection of the target circuit from a layout. The extracted circuit is modeled as a series comprising inverters (INV) 101 and 102 connected via a wire 103. Based on this circuit connection information, circuit configuration information in which a load is modeled by an RC component is produced, as shown in FIG. 10. A source model 106 corresponding to the inverter 101 is modeled by a combination of a power source 104 and resistance 105. A load component 108 comprises an RC distributed constant circuit 107 corresponding to the wire 103, and input pin capacitance Cg corresponding to the inverter 102, the RC distributed constant circuit 107 and the capacitance Cg being determined so that the admittance downstream from an output terminal of the gate provides a match with a third-order approximation.

The resistance and capacitance constituting the load component 108 is approximated by a finite number of RC components. The input capacitance of the RC distributed constant circuit 107 is modeled by capacitance C2. The combined output capacitance of the RC distributed constant circuit 107 and input pin capacitance Cg of the inverter 102 is modeled by capacitance C1. The capacitance C1, capacitance C2 and resistance R of the RC distributed constant circuit 107 form a π-load model 109 as shown in FIG. 11.

The π-load model, formed by two C components and one R component, is constructed such that, for any type of source model 106, a voltage waveform, occurring at the output terminal of the gate when the circuit of FIG. 10 is established, is approximated by a voltage waveform obtained as a result of analyzing the circuit of FIG. 11.

The approximation described above is disclosed in Peter R. O'Brien and Thomas L. Savarino, *Modeling the Driving-Point Characteristic of Resistive Interconnect for Accurate Delay Estimation*, Proc. IEEE International Conference on Computer-Aided Design, 1989. Admittance Y(s) looking downstream from the gate output terminal is estimated (FIG. 3, equations (19)–(32)). The admittance Y(s) thus obtained is used to estimate R, C1 and C2 (equations (14)–(16)).

The load model 109 is then connected to the source model 106 so as to estimate a delay time through response analysis. The voltage level of the power source 104 and the resistance 105 have respective values determined by modeling conditions. The method of computing the voltage level and resistance is described in details in Florentin Dartu, Noel Menezes, Jessica Qian, and Lawrence T. Pillage, *A Gate-Delay Model for High-Speed CMOS Circuits*, Proc. 31$^{st}$ ACM/IEEE Design Automation Conference, 1994, so that a detailed description is omitted.

A description will now be given of the operation according to the related art.

FIG. 12 shows a construction of the inverter 101 comprising a PMOS transistor and an NMOS transistor. In a rising transition at the output terminal Y, as the potential at the input terminal A goes from a high level (H) to a low level (L), the PMOS transistor P1 makes a transition from an OFF state to an ON state so as to charge an output load. When a decrease in the potential between the source and drain of the PMOS transistor P1 is relatively bigger than the magnitude of change in the gate potential, a transition from a region, characterized by an increase in a current with time, to another region characterized by a rapid exponential decrease in the current occurs (see pattern 2 of FIG. 5). Referring to FIG. 13, in the related-art source model 106, an internal voltage source E(t), whose voltage level shows a linear variation between 0 and Vdd in a time Δt, is used to represent the transition described above.

According to the related art, the π-load model 109 shown in FIG. 11 subject to delay estimation is approximated by a purely capacitive load model as shown in FIG. 14 providing an equivalent response. In this case, equivalent capacitance is determined by considering the shielding effect provided by the resistance R constituting the π-load model 109. A delay time is determined by searching a table listing delay time along with gradients of predetermined input waveforms and output load capacitance. The table is searched so that a delay time that matches the modeling condition is determined by interpolation.

The related-art delay time estimation has a disadvantage in that it is not adapted for another possible transition pattern (pattern 1 of FIG. 5) in which there is a transition from a first region, characterized by an increase in current with time, to a second region, characterized by a gradual decrease in current, and then to a third region, characterized by an exponential decrease. The related-art internal power source model E(t) as shown in FIG. 13, characterized by a linear variation between 0 and Vdd in a time Δt, fails to represent a saturation region in which the current gradually decreases (region 2 of FIG. 5). Therefore, the related-art method fails to provide delay time estimation that matches the operating characteristic of transistors.

Another disadvantage of the related art is that there is a need for a library of two-dimensional delay tables listing gradients of input waveforms and output load capacitance, thus making it necessary to store a large volume of data. Interpolation errors are incurred as a result of using the tables. If the π-load model is to be used instead of the purely capacitive model, the dimension of the table increases so that the volume of data is increased, thereby rendering its implementation impossible. The practice of conversion into equivalent capacitance, performed in this background, generates errors.

SUMMARY OF THE INVENTION

Accordingly, a general object of the present invention is to provide a delay time estimation method and a recording medium storing an estimation program in which the aforementioned disadvantages are eliminated.

Another and more specific object of the present invention is provide a precise delay time estimation method and a recording medium storing an estimation program in which a saturation region, characterized by a gradual decrease in current, is represented so that delay time estimation that matches the transistor characteristic.

The aforementioned objects can be achieved by a delay time estimation method for estimating a delay time in a logic circuit that includes a MOS transistor, comprising the steps of: modeling the MOS transistor by a resistive element having fixed resistance and a power source voltage that varies with time; and segmenting an operating characteristic of the MOS transistor thus modeled into a fist region in which a current increases as a gate potential varies, a second region corresponding to a saturation region of the MOS transistor in which region the current gradually decreases as the gate potential remains constant, and a third region corresponding to a linearity region of the MOS transistor in which region the current decreases as the gate potential remains constant.

The delay time estimation method may be adapted for a circuit in-which a plurality of logic circuits that includes MOS transistors and comprise the steps of: segmenting an operating characteristic of last-stage MOS transistor constituting a logic circuit of a last stage into a first region in which a current increases as a gate potential varies, a second region corresponding to a saturation region of the last-stage MOS transistor in which region the current gradually decreases as a gate potential remains constant and a third region corresponding to a linearity region of the last-stage MOS transistor in which region the current decreases as the gate potential remains constant.

$E = R_s \times i(t) + v(t)$ may hold for $t = \Delta t_1$ and $t = \Delta t_1 + \Delta t_2$, where E denotes the power source voltage, Rs denotes resistance of a model of the power source, i(t) denotes a charge current of a load model, v(t) denotes a charge voltage of the load model, and wherein $V_1$, $\Delta t_1$ and $\Delta t_2$ are determined based on a fact that values of E-v(t) and i(t) reside on an Ids-Vds characteristic curve at a given gate potential, where Ids denotes a drain-source current and Vds denotes a drain-source voltage, and where $V_1$ denotes a voltage at a boundary between the first region and the second region, $\Delta t_1$ denotes a time required to arrive at the boundary, and $\Delta t_2$ denotes time required to reach the power source voltage via the second region.

The delay time estimation method may employ a delay library including function information for specifying polygonal lines that provide a model of an Ids-Vds characteristic at a given potential and also including function information related to a slew rate specifying a fixed delay.

The aforementioned objects can also be achieved by a recording medium storing a computer program that executes a delay time computation method.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

First Embodiment

Figure 1:
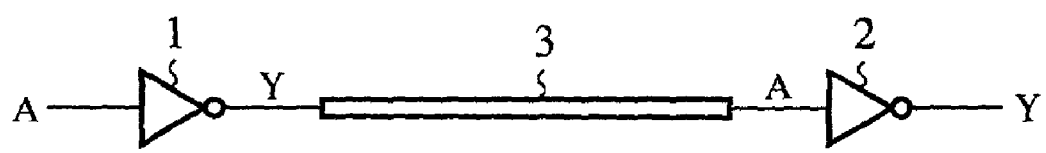
FIG. 1 illustrates extraction of circuit connection information according to a first embodiment of the present invention.
Figure 2:
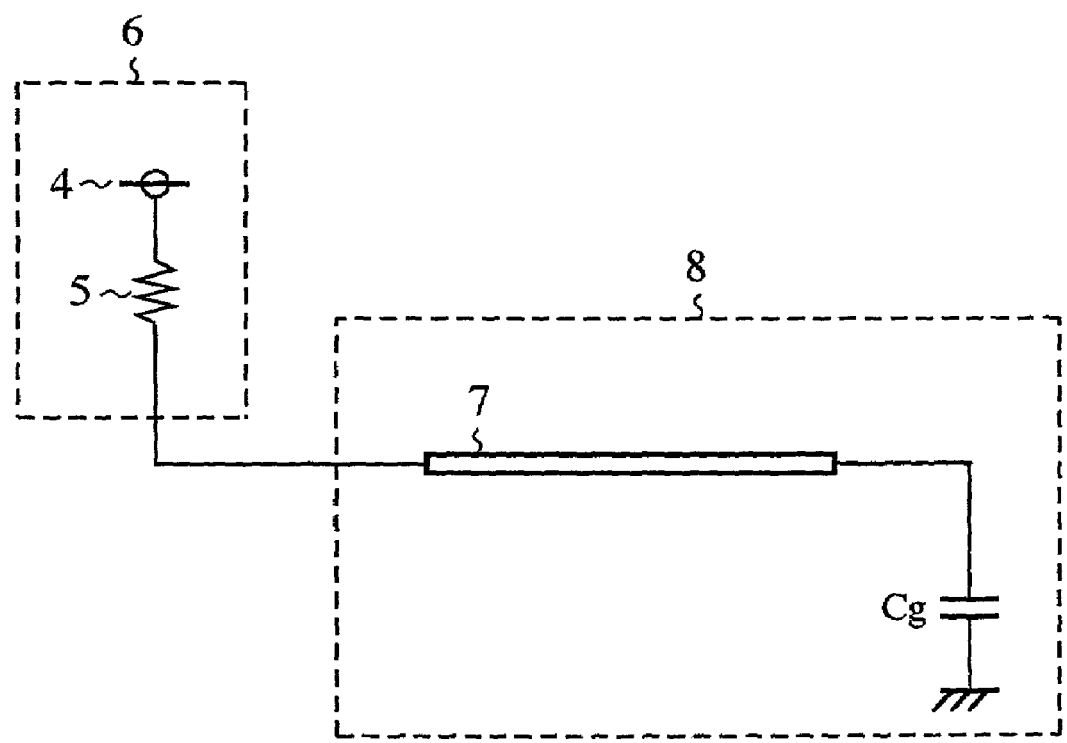
FIG. 2 illustrates generation of circuit configuration information.
Figure 3:
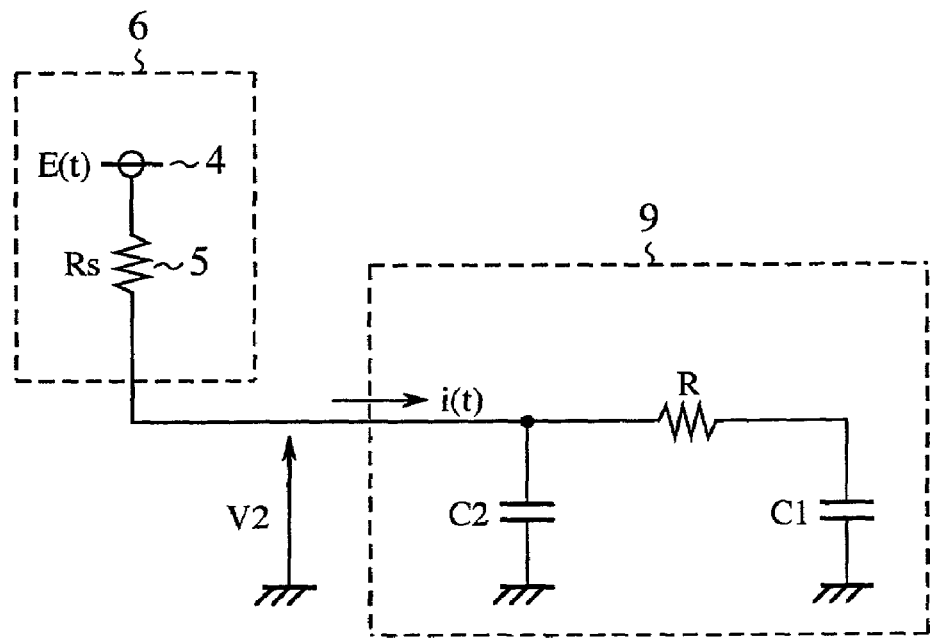
FIG. 3 illustrates generation of load model.
Figure 12:
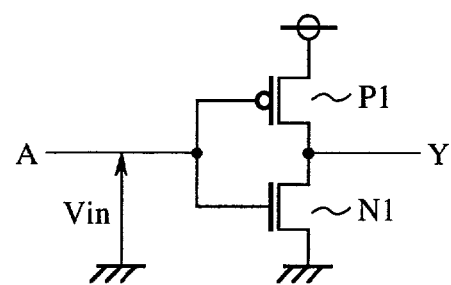
FIG. 12 illustrates logic paths of a two-input inverter circuit comprising two transistors.
Figure 13:
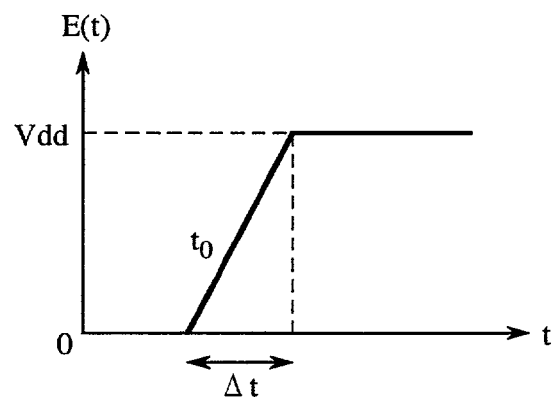
FIG. 13 is a graph showing variation of power source voltage with time according to the related art.
Figure 14:
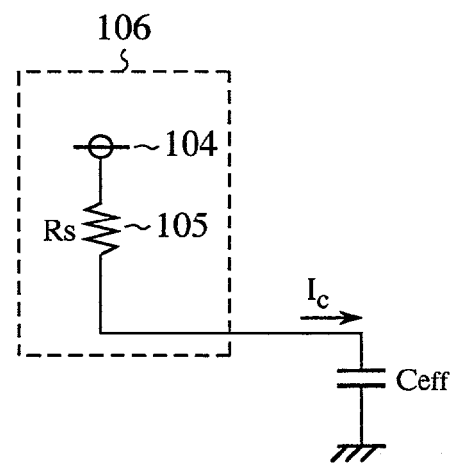
FIG. 14 is a purely capacitive approximation of a π-load model subject to delay time estimation.

FIGS. 1 through 3 show a processing flow for delay time estimation according to a first embodiment of the present invention. FIG. 1 shows extraction of circuit connection information comprising inverters 1 and 2 connected via a wire 3. Each of the inverters 1 and 2 is comprised of a PMOS transistor and a NMOS transistor (see FIG. 12). Circuit configuration information as shown in FIG. 2 is then generated. A source model 6 corresponding to the inverter 1 is modeled by a combination of a power source 4 and resistance 5. A load component 8 comprises a RC distributed constant circuit 7 corresponding to the wire 3, and input pin capacitance Cg corresponding to the inverter 2.

Figure 9:
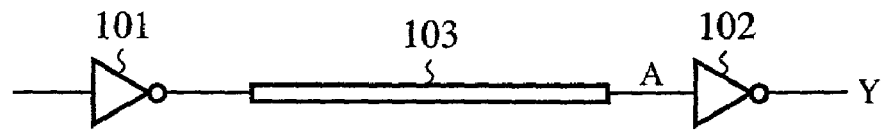
FIG. 9 illustrates extraction of circuit connection information according to the related art.
Figure 10:
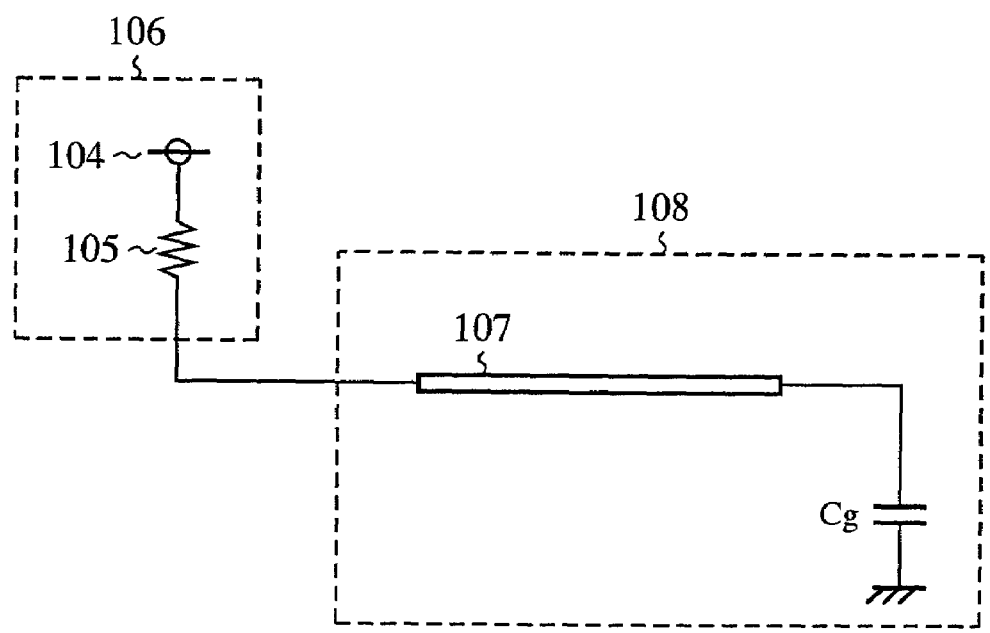
FIG. 10 illustrates generation of circuit configuration information according to the related art.
Figure 11:
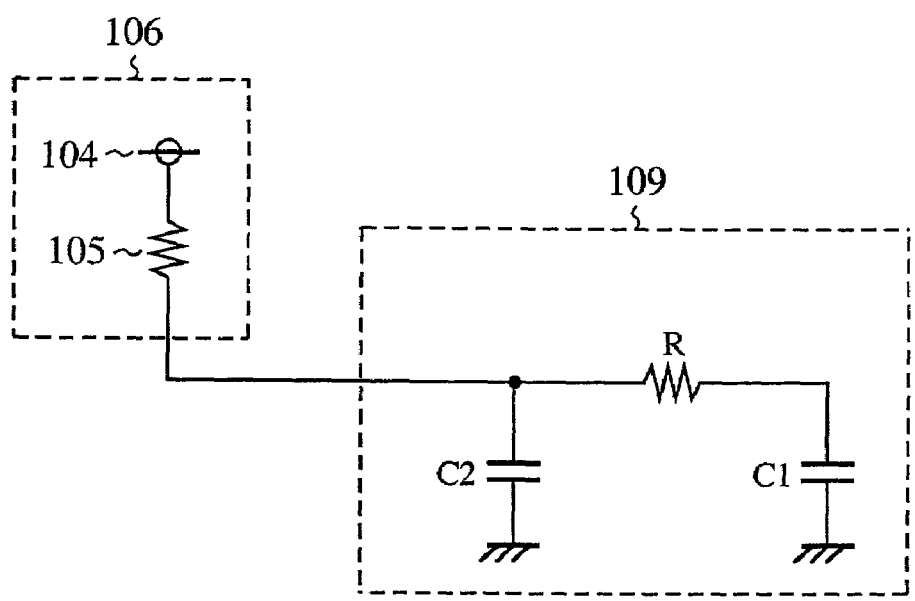
FIG. 11 illustrates generation of load model according to the related art.

The input capacitance of the RC distributed constant circuit 7 of the load component 8 is modeled by capacitance C2. The combined output capacitance of the RC distributed constant circuit 7 and input pin capacitance Cg is modeled by capacitance C1. The capacitance C1, capacitance C2 and resistance R of the RC distributed constant circuit 7 form a π-load model 9 as shown in FIG. 3. The description so far corresponds to the description of the related art with reference to FIGS. 9 through 11.

Figure 4:
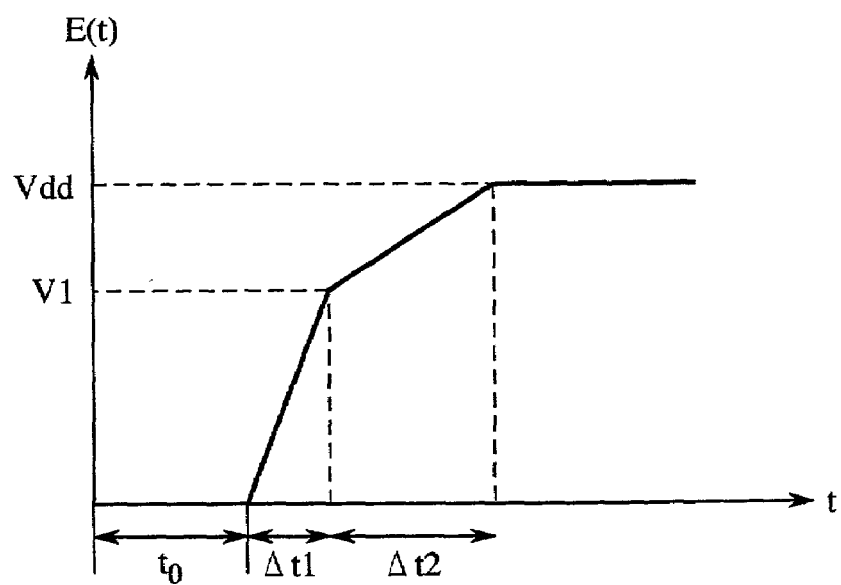
FIG. 4 is a graph showing variation of power source voltage with time.

The present invention introduces a model of a power source E, referred to hereinafter as an E(t) model, to represent the source model 6. In the E(t) model, time-dependence of the source resistor of the transistor is represented. As shown in FIG. 4, a power source voltage waveform is represented using polygonal lines. The voltage varies from 0 to $V_1$ in a time $\Delta t_1$ and varies from $V_1$ to Vdd in a time $\Delta t_2$.

Figure 5:
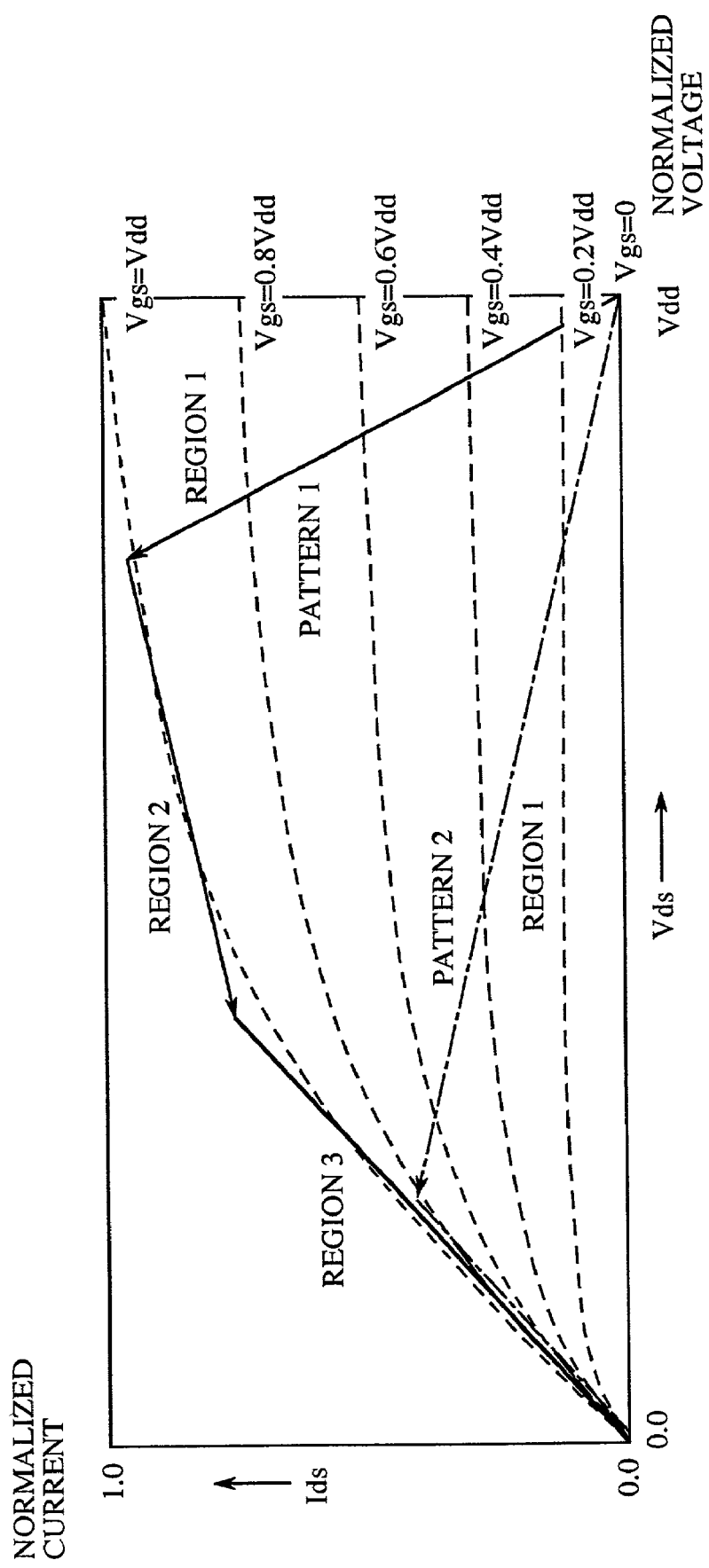
FIG. 5 is a graph showing patterns of waveform of a current.

The E(t) model according to the invention is designed to produce an appropriate match with a current flowing from an output pin of a gate to a load. Therefore, the current waveform is considered in determining the configuration of E(t). As shown in FIG. 5, two patterns of current waveforms could occur depending on the driving capability of the cell and the magnitude of the load. In a first pattern, the current makes a transition from region 1 in which the current increases with time, to region 2 in which the current gradually decreases and finally to region 3 in which the current decreases exponentially. In a second pattern, the current makes a transition from region 1 in which the current increases with time to region 3 in which the current rapidly decreases exponentially.

A consideration is given of the waveform of the E(t) model adapted for the current characteristic described above. Region 3 is a linearity region in which the current determined by the time constant of the circuit flows. Therefore, E(t)=Vdd is applicable to region 3. As a consequence of this, E(t) functions of different waveforms should be applied to region 1 and 2 respectively. The E(t) function for region 1 differs from that of region 2 with respect to variation with time. However, both E(t) functions for region 1 and 2 show continuity at points corresponding to respective bounds of region 1 and 2. As shown in FIG. 4, in the first embodiment, straight lines with different gradients are used to represent respective functions for respective regions to facilitate the ease of computation.

The time at which E(t) starts to rise does not always match a point of time t=0. The delay between the point of time t=0 and the time at which E(t) starts to rise is defined as a fixed delay $t_0$. The waveform of E(t) is expressed as a polygonal line showing that the voltage increases to E1 for a first period of time $\Delta t_1$ after an elapse of the fixed delay $t_0$. In a subsequent period of time $\Delta t_2$, the voltage increases to Vdd. $t_0$, $\Delta t_1$, $V_1$, $\Delta t_2$ indicate parameters that describe the circuit response.

The present invention introduces the use of a delay library. The delay library is constructed by function information $\Delta t_1$, $V_1$, $\Delta t_2$ specifying the Ids-Vds polygonal line at a given gate potential and by function information Tslew, Tslew being an input slew rate that specifies the fixed delay $t_0$, and given as a pre-extracted delay parameter. A large volume of data for the delay table according to the related art is not necessary. The fixed delay to is given as a function of $T_{slew}$. Tslew may be defined as a time that elapses before the input waveform completes its transition to 0 or Vdd. For example, the fixed delay $t_0$ is approximated by, for example, an equation $t_0(Tslew)=K_{10}+K_{20}*Tslew^\alpha$. In this case, the function information of the input slew rate specifying the fixed delay and stored in the delay library includes $K_{10}$, $K_{20}$ and α.

In pattern 2, region 2 is absent. In this case, the waveform of E(t) adapted for transition from region 1 to region 3 is given assuming that $\Delta t_2=0$ and $V_1=E$.

Using the waveform of E(t) shown in FIG. 4, the gate output $v_2(t)$ of the model at a rising edge of the waveform is defined by the following equations.

First, under the following definition of z, p1, p2 denoting poles of a transfer function, $$\begin{cases} z = \dfrac{1}{RC_1} + \dfrac{1}{RC_2} \\ p_1, p_2 = \dfrac{1}{2}\left\{\left(\dfrac{1}{RC_1} + \dfrac{1}{RC_2} + \dfrac{1}{RsC_2}\right) \pm \sqrt{\left(\dfrac{1}{RC_1} + \dfrac{1}{RC_2} + \dfrac{1}{RsC_2}\right)^2 - \dfrac{4}{RRsC_1C_2}}\right\} \end{cases} \quad (1)$$

functions f(t,Δt,V) and a(t,V) are defined as follows:

$$\begin{cases} f(t, \Delta t, V) = \left\{ t - \dfrac{z}{p_1 p_2} + \dfrac{p_1 - z}{p_1(p_1 - p_2)}\exp(-p_1 t) - \dfrac{p_2 - z}{p_2(p_1 - p_2)}\exp(-p_2 t) \right\} \dfrac{V}{\Delta t} \\ a(t, V) = \left\{ 1 - \dfrac{p_1 - z}{p_1 - p_2}\exp(-p_1 t) + \dfrac{p_1 - z}{p_1 - p_2}\exp(-p_2 t) \right\} V \end{cases} \quad (2)$$

Then, a model waveform description of $v_2(t)$ will now be defined more specifically in the following.

$$\text{<Case 1> } \Delta t_1 = 0 \quad (3)$$

$$v_2(t) = \begin{cases} 0 & (0 \leq t \leq t_0) \\ a(t - t0, V_1) + f(t - t_0, \Delta t_2, E - V_1) & (t_0 < t \leq t_0 + \Delta t_2) \\ a(t - t0, V_1) + f(t - t_0, \Delta t_2, E - V_1) - f(t - t_0 - \Delta t_2, \Delta t_2, E - V_1) & (t > t_0 + \Delta t_2) \end{cases}$$

$$\text{<Case 2> } \Delta t_2 = 0 \quad (4)$$

$$v_2(t) = \begin{cases} 0 & (0 \leq t \leq t_0) \\ f(t - t_0, \Delta t_1, E) & (t_0 \leq t \leq t_0 + \Delta t_1) \\ f(t - t_0, \Delta t_1, E) - f(t - t_0 - \Delta t_1, \Delta t_1, E) & (t > t_0 + \Delta t_1) \end{cases}$$

$$\text{<Case 3> } \Delta t_1, \Delta t_3 \neq 0 \quad (5)$$

$$v_2(t) = \begin{cases} 0 & (0 \leq t \leq t_0) \\ f(t - t_0, \Delta t_1, V_1) & (t_0 \leq t \leq t_0 + \Delta t_1) \\ f(t - t_0, \Delta t_1, V_1) - f(t - t_0 - \Delta t_1, \Delta t_1, V_1) + & (t_0 + \Delta t_1 < t \leq t_0 + \Delta t_1 + \Delta t_2) \\ \quad f(t - t_0 - \Delta t_1, \Delta t_2, E - V_1) & \\ f(t - t_0, \Delta t_1, V_1) - f(t - t_0 - \Delta t_1, \Delta t_1, V_1) + & (t > t_0 + \Delta t_1 + \Delta t_2) \\ \quad f(t - t_0 - \Delta t_1, \Delta t_2, E - V_1) - f(t - t_0 - \Delta t_1 - \Delta t_2, \Delta t_2, E - V_1) & \end{cases}$$

Figure 6:
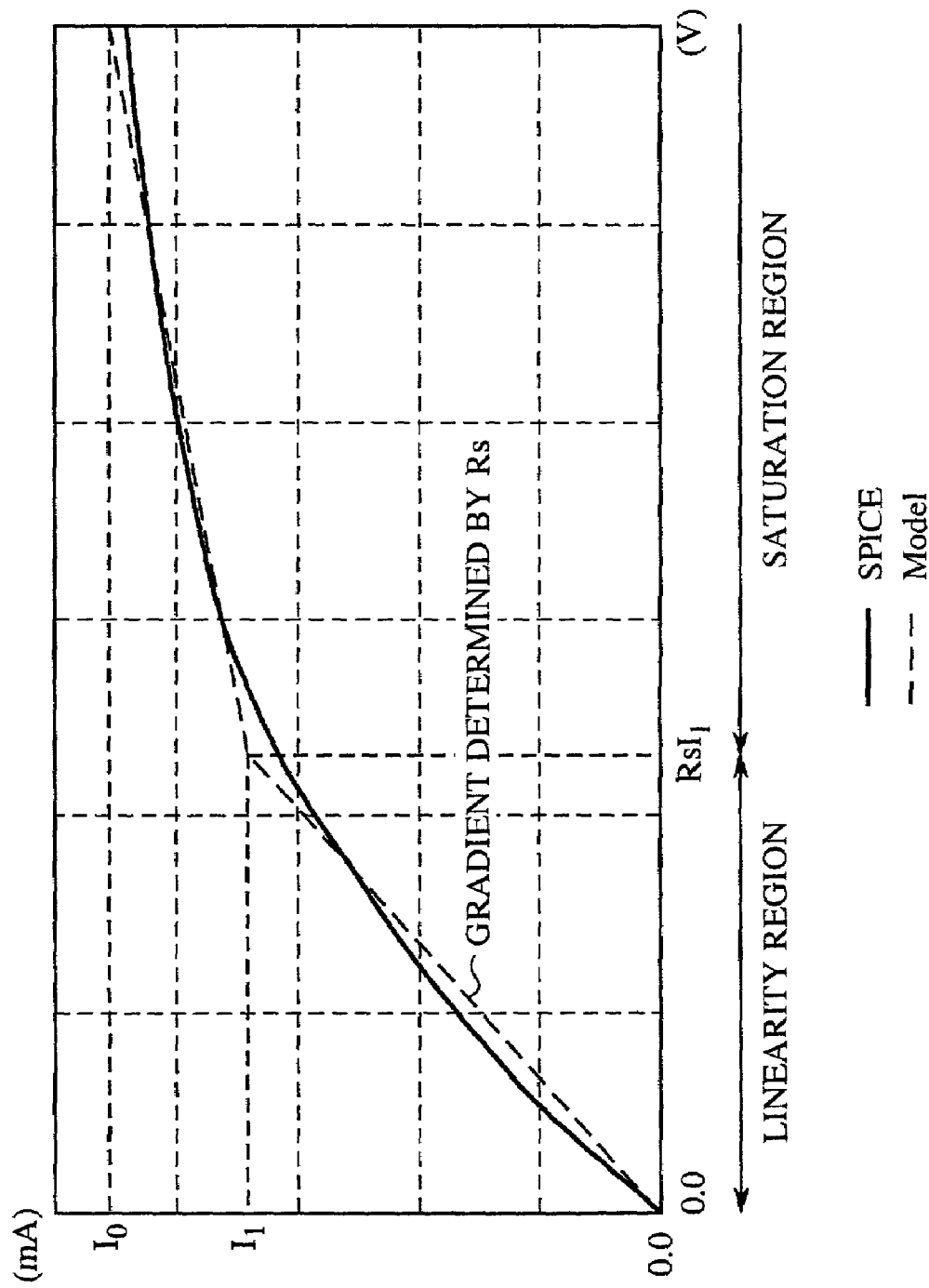
FIG. 6 is a Ids-Vds characteristic graph according to the E(t) model of the present invention.

A description will now be given of determination of the function information $\Delta t_1$, $V_1$ and $\Delta t_2$ that specify the polygonal lines of Ids-Vds characteristic. Referring FIG. 5 showing transitions of the operating point of the transistor, three types of transitions, i.e., transition from region 1 to region 2, transition from region 1 to region 3 and transition from region 2 to region 3 are bounded by respective turning points. All of the three turning points reside on the Ids-Vds characteristic where Vgs=Vdd. This means that the turning points can be defined when the Ids-Vds characteristic where Vgs=Vdd is available. Region 3 corresponds to the linearity region of the MOS transistor, where charging and discharging occurs via a fixed resistance Rs, as required by the model. Therefore, the Ids-Vds characteristic of region 3 should be described under the condition Ids=Vds/Rs. Region 2 corresponds to the saturation region of the MOS transistor and described as a region where the current gradually decreases. In order to describe these features, the Ids-Vds characteristic where Vgs=Vdd is represented as shown in FIG. 6, using Rs, $I_0$ and $I_1$. In this model, the region where Vds≦$RsI_1$ is defined as the linearity region, and the region where Vds>$RsI_1$ is defined as the saturation region. By defining the saturation current $I_0$ when Vds=Vdd separately, the characteristic where the current gradually decreases as Vds decreases (V2 increases) in the saturation region is depicted.

In determining $\Delta t_1$, $V_1$ and $\Delta t_2$, Rs, $I_0$ and I1 are given as pre-extracted parameters.

1. Determination of $\Delta t_1$

First, $\Delta t_1$ is determined. In determining $\Delta t_1$, it is assumed that the transistor operates according to pattern 2. From the E(t) model circuit diagram shown in FIG. 3, it is known that $$E(t) = v_2(t) + Rsi(t) \quad (6)$$

Since we are assuming that pattern 2 takes place, transition occurs from region 1 to region 3. At a turning point $t = t_0 + \Delta t1$, $E(t_0 + \Delta t1) = E$ so that $$v_2(t_0 + \Delta t_1) + Rsi(t_0 + \Delta t_1) = E \quad (7)$$

Since it is assumed that the transistor operates according to pattern 2, $\Delta t_2 = 0$ so that equation (4) is used $$v_2(t_0 + \Delta t_1) = \left\{ \Delta t_1 - \dfrac{z}{p_1 p_2} + \right. \quad (8)$$

-continued $$\frac{p_1-z}{p_1(p_1-p_2)}\exp(-p_1\Delta t_1) - \frac{p_2-z}{p_2(p_1-p_2)}\exp(-p_2\Delta t_1)\bigg\}\frac{E}{\Delta t_1}$$

Where $i(t+\Delta t_1)$ is a current in the saturation region.

(1) According to the simplest transistor model, $i \propto (Vgs-Vth)^2$. Approximating Vgs by a linear equation, $i \propto t^2$.

(2) If we consider the fixed delay, $i=0$ at $t=t_0$.

(3) Using the linear equation approximation, Vgs=Vdd at t=Tslew, resulting in the Ids-Vds characteristic of FIG. 6. The current at t=Tslew is equal to the current $I_1$ at the boundary of the linearity region and the saturation region where Vgs=Vdd. Therefore, $i=I_1$ at t=Tslew. The equation that satisfies this condition is given by $$i(t) = I_1\left(\frac{t-t_0}{Tslew-t_0}\right)^2 \qquad (9)$$

Equation (9) is used for $i(t_0+\Delta_1)$. Substituting these equations into (7), we obtain $$\left\{-\frac{z}{p_1 p_2} + \frac{p_1-z}{p_1(p_1-p_2)}\exp(-p_1\Delta t_1)\frac{p_2-z}{p_2(p_1-p_2)}\exp(-p_2\Delta t_1)\right\}E + \qquad (10)$$

$$RsI_1\Delta\frac{t_1^3}{(Tslew-t_0)^2} = 0$$

This equation has a solution at $\Delta t_1$.

When the solution to equation (1) is $\Delta t_1 > Tslew-t_0$, $i(t_0+\Delta t_1) > I_1$ so that there is digression from the Ids-Vds characteristic of FIG. 6 since the boundary between region 1 and region 3 must reside on a straight line defining the gradient determined by RS. The reason for this is that the initial assumption that pattern 2 is the operation pattern failed as a result of transition from region 1 to region 2. In this case, we should proceed assuming that the transistor operates according to pattern 1. In pattern 1, the boundary between region 1 and region 2 is at $t=t_0+\Delta t_1$ where Vgs=E. Using the same linear equation for Vgs, the time is given by t=Tslew so that $\Delta t_1 = Tslwe-t_0$.

In an exceptional case, it may be that $Tslew-t_0 \leq 0$. This is considered as a situation where it takes the current to take time before being output and where Vgs=E already when the output current starts flowing. According to the model, instant transition to the Ids-Vds where Vgs=Vdd occurs. Therefore, a model results in which region 1 is absent so that the operation starts in region 2 ($\Delta t_1=0$).

Summarizing the above discussion, $\Delta t_1$ is determined depending on the respective conditions as described below.

(1) Case 1: $Tslew-t_0 \leq 0$
    $\Delta t^1 = 0$ (2) Case 2: $0 < \Delta t_1 \leq Tslew-t_0$
    $\Delta t_1$ satisfies the following equation $$\left\{-\frac{z}{p_1 p_2} + \frac{p_1-z}{p_1(p_1-p_2)}\exp(-p1\Delta t_1)\frac{p_2-z}{p_2(p_1-p_2)}\exp(-p_2\Delta t_1)\right\}E + \qquad (11)$$

$$RsI_1\Delta\frac{t_1^3}{(Tslew-t0)^2} = 0$$

(3) Case 3: when the solution to equation (11) is $\Delta t_1 > Tslew-t_0$
    $\Delta t_1 = Tslew-t_0$ 2. Determination of $V_1$
    The following relationship holds for $V_1$.

$$V_2(t_0+\Delta t_1) + Rsi(t_0+\Delta t_1) = v_1 \qquad (12)$$

$V_1$ is determined based on equation (12).

(1) Case 1: $\Delta t_1 = 0$
    Vgs=Vdd at $t=t_0$ so that $I(t_0)$ resides on the Ids-Vds characteristic of FIG. 6. From the definition of the fixed delay, $v_2(t_0)=0$ so that Vds=Vdd, showing that $i(t_0)=I_0$. Accordingly, $$V_1 = RsI_0 \qquad (13)$$

(2) Case: $0 < \Delta t_1 \leq sTslew-t_0$
    In this case, the transistor operates according to pattern 2 where the transition from region 1 to region 3 occurs. Therefore, $$V_1 = E \qquad (14)$$

Figure 7:
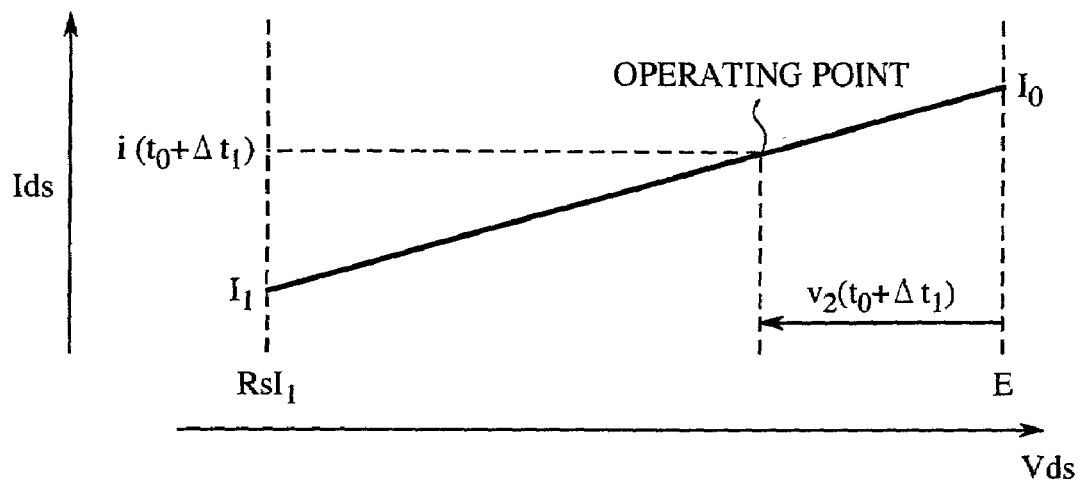
FIG. 7 is an illustration of an operating point.

(3) Case 3: $\Delta t_1 = Tslew-t_0$
    Under this condition, the transistor operates according to pattern1 so that Vgs=Vdd at $t=t_0+\Delta t_1$. Since $0 < v_2(t_0+\Delta t_1) < RsI_1$, the operating point resides at a position shown in FIG. 7. In this case, $i(t_0+\Delta t_1)$ is given by the following equation.

$$i(t_0+\Delta t_1) = I_0 - \frac{v_2(t_0+\Delta t_1)}{E - RsI_1}(I_0-I_1) \qquad (15)$$

Using equation (5), $v_2(t_0+\Delta t_1)$ is given by the following equation.

$$v_2(t_0+\Delta t_1) = \left\{\Delta t_1 - \frac{z}{p_1 p_2} + \right. \qquad (16)$$

$$\left. \frac{p_1-z}{p_1(p_1-p_2)}\exp(-p_1\Delta t_1) - \frac{p_2-z}{p_2(p_1-p_2)}\exp(-p_2\Delta t_1)\right\}\frac{V_1}{\Delta t_1}$$

From the equations (12), (15) and (16), $V_1$ is given by the following equation.

$$v_1 = \frac{RsI_0}{1 - \frac{E-RsI_0}{E-RsI_1}\left\{\Delta t_1 - \frac{z}{p_1 p_2} + \frac{p_1-z}{p_1(p_1-p_2)}\exp(-p_1\Delta t_1)\frac{p_2-z}{p_2(p_1-p_2)}\exp(-p_2\Delta t_1)\right\}\frac{1}{\Delta t_1}} \qquad (17)$$

3. Determination of $\Delta t_2$

In case 2, the transistor operates according to pattern 2 so that $\Delta t_2$ is equal to 0. In case 1 and case 3, the following equation holds at a boundary between region 2 and region 3.

$$v_2(t_0+\Delta t_1+\Delta t_2)+Rsi(t_0+\Delta t_1+\Delta t_2)=E \tag{18}$$

Region 2 is a saturation region where Vgs=Vdd. At the boundary between region 2 and region 3, $i=I_1$. For $v_2(t_0+\Delta t_1+\Delta t_2)$, equation (3) (for case 1) or equation (for case 3) is used similarly to the other processes for determination of the function information.

Therefore, $\Delta t_2$ for case 1 or case 3 satisfies $$v_2(t_0+\Delta t_1+\Delta t_2)+RsI_1=E \tag{19}$$

In case 1 or case 3, equation (19) has a solution at $\Delta t_2 > 0$.

A summary is given below how the function information is determined for different cases.

<Case 1> Tslew$-t_0 \leq 0$
$\Delta t_1 = 0$
$V_1 = RsI_0$
$\Delta t_2$ should satisfy
$v_2(t_0+\Delta t_1+\Delta t_2)+RsI_1=E$ <Case 2> $0 < \Delta t_1 \leq $ Tslew$-t_0$, where $\Delta t_1$ is a solution to the equation below $$\left\{-\frac{z}{p_1 p_2} + \frac{p_1-z}{p_1(p_1-p_2)}\exp(-p_1\Delta t_1)\frac{p_2-z}{p_2(p_1-p_2)}\exp(-p_2\Delta t_1)\right\}E + \tag{20}$$

$$RsI_1\Delta\frac{t_1^3}{(Tslew-t_0)^2} = 0を満たす \Delta t_1$$

$$V_1 = E$$

$$\Delta t_2 = 0$$

<Case 3> when the first solution to the equation (20) is $\Delta t_1 > $ Tslew$-t_0$ transistor having its input controlled controls the input of the next transistor so as to operate the output transistor.

Figure 8:
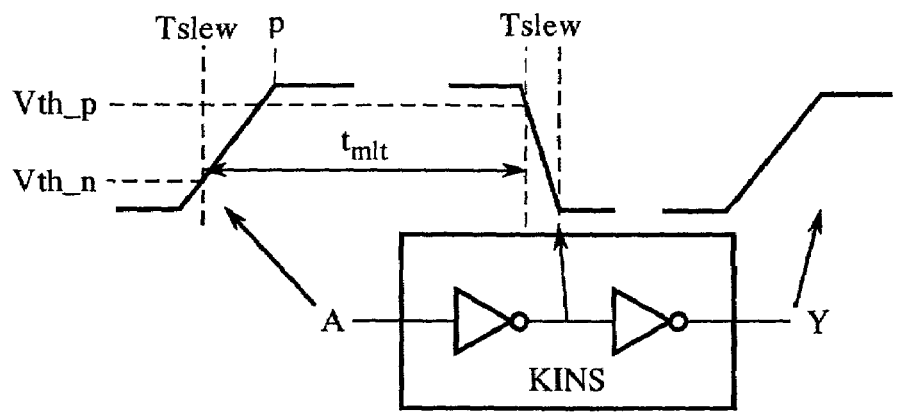
FIG. 8 illustrates delay time estimation in multiple-stage cells.

The method of estimation for the single-cell configuration applies equally to the last stage of the multi-stage cell. Therefore, for the last stage, the same computation as performed for the single-cell is performed. In order to effect this computation, it is necessary to know the time to arrive at Vth and the value of Tslew for the input of the last stage of the internal node. A description will be given with reference to FIG. 8.

Vth_n denotes the threshold voltage of the NMOS transistor in the cell (inverter), Vth_p denotes the threshold voltage of the PMOS transistor in the cell (inverter). TslewP indicates the time required for the input waveform of the first stage cell to go from Vth_n to the power source voltage Vdd. T slewN indicates the time required for the output waveform of the first stage cell (input waveform of the last stage cell) to go from Vth_p to the ground voltage 0V.

The waveform of the first stage may be used to determine the time 0 and Tslew of the the corresponding cell. The reference time for computation of the last stage delayed with respect to the input to the cell. The delay time is denoted $t_{mlt}$. Tslew of the last stage is different from Tslew$_p$.

In the multi-stage cell, the delay time is determined by adding the delay determined using Tslew to $t_{mlt}$. Therefore, in the multi-stage cell, the method for estimation of Tslew and $T_{mlt}$ should be determined. Both Tslew and $t_{mlt}$ are internal node values and, therefore, are not considered to be dependent on the load connected to the output Y. Accordingly, Tslew and $t_{mlt}$ are functions of Tslew$_p$ specifying the waveform of the input A. The same approach employed to estimate the fixed delay of the single-stage cell is employed to estimate Tslew and $t_{mlt}$. That is, Tslew and $t_{mlt}$ are $$\Delta t_1 = Tslew - t_0 \tag{21}$$

$$V_1 = \frac{RsI_0}{1 - \frac{E-RsI_0}{E-RsI_1}\left\{\Delta t_1 - \frac{z}{p_1 p_2} + \frac{p_1-z}{p_1(p_1-p_2)}\exp(-p_1\Delta t_1) - \frac{p_2-z}{p_2(p_1-p_2)}\exp(-p_2\Delta t_1)\right\}\frac{1}{\Delta t_1}}$$

$$v_2(t_0 + \Delta t_1 + \Delta t_2) + RsI_1 = Eを満たす \Delta t_2$$

The concept described above applies equally to the rising edge and the falling edge.

As described, according to the first embodiment, the power source is represeted as two types of combinations of straight lines showing variation with time. Accordingly, the gradual decrease of current in the saturation region of the transistor is properly reflected so that the delay time is estimated in a precise manner.

Second Embodiment

The method of estimation described above applies to a single-stage cell configuration in which the input directly controls the gate of the output transistor. In a multi-stage cell configuration (for example, a driving cell) the drain of the considered to increase as Tslew$_p$ increases. Accordingly, the internal delay of the multi-stage cell is given by $$t_{mlt}=K_{1m}+K_{2m}Tslew_p^{\alpha_m} \tag{22}$$

Tslew internal to the multi-stage cell is given by $$Tslew=K_{1t}+K_{2t}Tslew_p^{\alpha_t} \tag{23}$$

where $K_{1m}$, $K_{2m}$, $\alpha_m$, $K_{1t}$, $K_{1t}$ and $\alpha_t$ indicate delay parameters extracted before the estimation. These delay parameters are stored in the delay library. $t_{mlt}$ and Tslew are determined by using the delay library.

In delay time estimation, computation of internal node values is either skipped or not skipped depending on whether the single-stage cell or the multi-stage cell is subject to estimation. An efficient approach is to provide the following conditions in equations (22) and (23) when the single-stage cell is under consideration so that $t_{mlt}=0$ and $Tslew=Tslew_p$.

$$K_{1m}=K_{2m}=0, \alpha_m=1$$

$$K_{1r}=0, K_{2r}=\alpha_r=1 \qquad (24)$$

As described, accordingly to the second embodiment, a plurality of logic stages (CMOS logic gates) in a cell is divided into the last stage and the preceding stage(s). By estimating the waveform of the gate input at the last stage, the polygonal lines of the power source are estimated in a precise manner.

Third Embodiment

A recording medium is provided that stores a computer program for executing a delay time estimation according to the first and second embodiments. When a computer reads the program from the medium and executes the same, the delay time estimation of the invention can be efficiently performed.

The present invention is not limited to the above-described embodiments, and variations and modifications may be made without departing from the scope of the present invention.

What is claimed is:

1. A delay time estimation method for estimating a delay time in a logic circuit that includes a MOS transistor said method comprising the steps of:

constructing a delay library including function information for specifying a model of an Ids-Vds characteristic at a given gate potential and also including function information related to a slew rate specifying a fixed delay, where Ids denotes a drain-source current and Vds denotes a drain-source voltage;

modeling the MOS transistor by a resistive element having fixed resistance and a power source voltage that varies with time;

determining an operating current characteristic of the MOS transistor thus modeled and segmenting the operating current characteristic based upon the delay library into a first region in which a current increases as a gate potential varies, a second region corresponding to a saturation region of the MOS transistor in which region the current gradually decreases as the gate potential remains constant, and a third region corresponding to a linearity region of the MOS transistor in which region the current decreases as the gate potential remains constant; and storing the determined estimated delay time of the MOS transistor and output thereof.

2. The delay time estimation method according to claim 1, wherein said logic circuit is constructed by a plurality of cells each including a MOS transistor, wherein the delay estimation is executed to the cell at the last stage of said logic circuit.

3. The delay time estimation method according to claim 1, wherein $$E=Rs \times i(t)+v(t)$$

holds for $t=\Delta t_1$ and $t=\Delta t_1+\Delta t_2$, where E denotes the power source voltage, Rs denotes resistance of a model of the power source, i(t) denotes a charge current of a load model, v(t) denotes a charge voltage of the load model, and wherein $V_1$, $\Delta t_1$ and $\Delta t_2$ are determined based on a fact that values of $E-v(t)$ and $i(t)$ reside on an Ids-Vds characteristic curve at a given gate potential, where Ids denotes a drain-source current and Vds denotes a drain-source voltage, and where $V_1$ denotes a voltage at a boundary between the first region and the second region, $\Delta t_1$ denotes a time required to arrive at the boundary, and $\Delta t_2$ denotes time required to reach the power source voltage via the second region.

4. A recording medium storing a computer program that allows a computer to perform the delay time computation method according to claim 1.

5. The delay time estimation method according to claim 2, further comprising the step of determining an input slew rate of a waveform input in said cell at the last stage and an internal delay of said logic circuit based on an input slew rate of a waveform input in said logic circuit and a delay parameter extracted for said logic circuit.

* * * * *